(12) United States Patent
Arhammar et al.

(10) Patent No.: US 10,995,399 B2
(45) Date of Patent: May 4, 2021

(54) CUTTING TOOL

(71) Applicant: SANDVIK INTELLECTUAL PROPERTY AB, Sandviken (SE)

(72) Inventors: Cecilia Arhammar, Uppsala (SE); Jose Luis Garcia, Stockholm (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 755 days.

(21) Appl. No.: 15/569,706

(22) PCT Filed: Apr. 26, 2016

(86) PCT No.: PCT/EP2016/059276
§ 371 (c)(1),
(2) Date: Oct. 26, 2017

(87) PCT Pub. No.: WO2016/174028
PCT Pub. Date: Nov. 3, 2016

(65) Prior Publication Data
US 2018/0127862 A1    May 10, 2018

(30) Foreign Application Priority Data
Apr. 30, 2015   (EP) .................................... 15165935

(51) Int. Cl.
| | | |
|---|---|---|
| *C23C 8/20* | (2006.01) | |
| *C22C 29/08* | (2006.01) | |
| *C23C 8/64* | (2006.01) | |
| *B22F 3/10* | (2006.01) | |
| *B22F 5/00* | (2006.01) | |

(Continued)

(52) U.S. Cl.
CPC .............. *C23C 8/20* (2013.01); *B22F 3/1007* (2013.01); *C22C 29/08* (2013.01); *C23C 8/02* (2013.01); *C23C 8/64* (2013.01); *C23C 24/06* (2013.01); *C23C 24/103* (2013.01); *C23C 30/005* (2013.01); *B22F 9/04* (2013.01); *B22F 9/082* (2013.01); *B22F 2005/001* (2013.01); *B22F 2999/00* (2013.01); *C23C 16/34* (2013.01)

(58) Field of Classification Search
CPC ......... B24D 18/00; C22C 29/02; C22C 29/08; C23C 8/02; C23C 29/08
See application file for complete search history.

(56) References Cited

U.S. PATENT DOCUMENTS

| | | |
|---|---|---|
| 4,820,482 A | 4/1989 | Fischer et al. |
| 5,310,605 A | 5/1994 | Baldoni et al. |
| (Continued) | | |

FOREIGN PATENT DOCUMENTS

| | | |
|---|---|---|
| EP | 603143 A2 | 6/1994 |
| EP | 1048750 A1 | 11/2000 |
| (Continued) | | |

*Primary Examiner* — Pegah Parvini
(74) *Attorney, Agent, or Firm* — Corinne R. Gorski

(57) ABSTRACT

A cutting tool has a substrate of cemented carbide including WC and a binder phase. The cutting tool has a gradient surface zone with a thickness of between 50-400 μm having a binder phase gradient with the lowest binder phase content in the outermost part of the gradient surface zone and wherein the cutting tool also includes free graphite. The present disclosure also relates to a method of making a cutting tool according to the above. The cemented carbide body shows improved resistance towards chemical wear when used for machining non-ferrous alloys such as Ti-alloys and Ni-based alloys.

13 Claims, 3 Drawing Sheets

(51) Int. Cl.
*C23C 8/02* (2006.01)
*C23C 24/10* (2006.01)
*C23C 24/06* (2006.01)
*C23C 30/00* (2006.01)
B22F 9/04 (2006.01)
B22F 9/08 (2006.01)
C23C 16/34 (2006.01)

(56) References Cited

U.S. PATENT DOCUMENTS

| | | |
|---|---|---|
| 5,761,593 A | 6/1998 | Ostlund et al. |
| 6,447,912 B1 | 9/2002 | Mikus et al. |
| 2005/0276717 A1 | 12/2005 | Zhigang |
| 2010/0101368 A1 | 4/2010 | Fang et al. |
| 2013/0118308 A1 | 5/2013 | Fang et al. |

FOREIGN PATENT DOCUMENTS

| | | |
|---|---|---|
| JP | H04294907 A | 10/1992 |
| JP | 3046336 B2 | 5/2000 |
| JP | 3080983 B2 | 8/2000 |
| WO | 2005056854 A1 | 6/2005 |
| WO | 2014191505 A1 | 12/2014 |
| WO | 2014191511 A1 | 12/2014 |

CUTTING TOOL

RELATED APPLICATION DATA

This application is a § 371 National Stage Application of PCT International Application No. PCT/EP2016/059276 filed Apr. 26, 2016 claiming priority to EP Application No. 15165935.6 filed Apr. 30, 2015.

TECHNICAL FIELD

The present invention relates to a cutting tool comprising a substrate of cemented carbide which is suitable for machining non-ferrous alloys, most suitable for Ti-alloys and Ni-based alloys. The cutting tool comprises a gradient surface zone with a binder phase gradient with the lowest binder phase content in the outermost part of the gradient surface zone. The cemented carbide body also comprises free graphite.

BACKGROUND

Cutting tools made of cemented carbide are well known in the art for machining Ti-alloys and Ni-alloys. One problem that can occur when machining these types of work piece materials is chemical wear.

Chemical wear is common for machining Ti-alloys. Therefore, the solubility and reactivity with the work piece material is found to be very important when selecting an insert for machining Ti-alloys. The extremely low thermal conductivity of Ti causes heat transfer to the insert and enhanced chemical reactivity.

The impact of the carbon content on the cemented carbide structure is known in the art. A shortage of carbon leads to the formation of eta phase, e.g. $W_6Co_6C$, $W_3Co_3C$, whereas an excess of carbon leads to precipitation of free graphite. The carbon content is usually balanced so that either eta phase or graphite is formed. Both eta phase and graphite are considered to be something to avoid.

SUMMARY OF THE INVENTION

One object of the present invention is to improve the tool life for cutting tools when machining non-ferrous materials by reducing the chemical wear.

The chemical wear leads—among others—to the formation of a Co—Ti melt, fast diffusion of carbon in the cobalt and a chemical reaction between Ti and C. Ti reacts with C from the WC grains leading to degradation of WC and eta-phase ($W_6Co_6C$, $W_3Co_3C$) or $W_2C$ formation. This causes embrittlement of the cemented carbide, rip out of grains and rapid wear of the tool which reduces the tool life considerably.

The present invention relates to a cutting tool comprising a substrate of cemented carbide comprising WC and a binder phase with a gradient surface zone with a thickness of between 50-400 µm having a binder phase gradient with the lowest binder phase content in the outermost part of the gradient surface zone wherein the cutting tool comprises free graphite.

The present invention also relates to a method of making a cutting tool of cemented carbide comprising the following steps:

providing a first cemented carbide body with a carbon content within a range determined by the width of the two-phase region at 1000° C. in the phase diagram for that particular cemented carbide composition and subjecting said first cemented carbide body to a sintering step in a carburizing environment such that a gradient surface zone with a thickness of between 50-400 µm is formed.

The present invention also relates to the use of a cutting tool as described herein for machining in Ti or Ti-alloys.

It has been discovered that when a cutting tool according to the present invention is used for machining a Ti-alloy, the free graphite in the cemented carbide and especially in the gradient surface zone, interacts chemically with the Ti in the work piece material during machining. This interaction is one of the reasons that the cemented carbide according to the present invention will lead to an increased tool life.

DETAILED DESCRIPTION OF THE INVENTION

Figure 1:
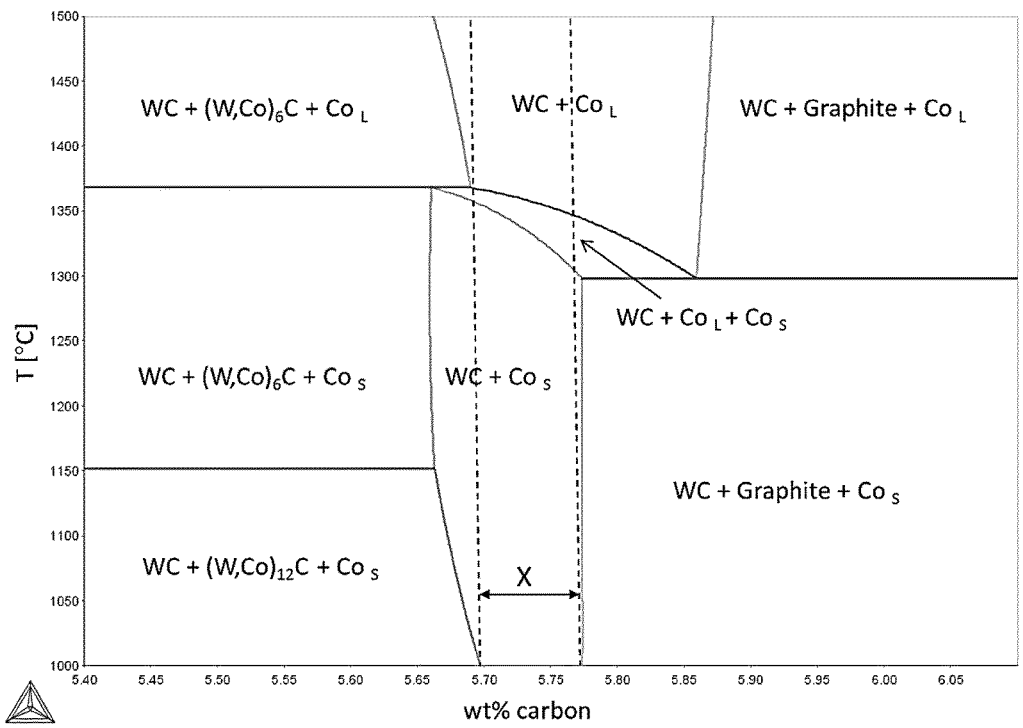
FIG. 1 shows a phase diagram for cemented carbide containing WC and 6 wt % Co.

The WC in the cemented carbide according to the present invention suitably has an average grain size of between 0.4 to 10 µm, preferably between 1.2 to 4.0 µm.

In addition to WC and a binder phase, the cemented carbide can also comprise other constituents common in the art of making cemented carbides e.g. Nb, Ta, Ti and Cr. The amount of these elements may vary between 20 ppm by weight and 5 wt % of the total cemented carbide.

In one embodiment of the present invention, the amount of additional constituents, i.e. in addition to WC, is between 20 ppm by weight and 1 wt %, preferably between 20 and 250 ppm by weight of the total cemented carbide.

In another embodiment of the present invention, WC is the only hard constituent present.

The cemented carbide can also comprise small amounts of other elements common in the art, such as rare earths, oxides, aluminides and borides.

The binder phase content in the cutting tool comprising a substrate of cemented carbide is suitably between 2 to 25 wt %, preferably between 4 to 10 wt % and more preferably 5 to 7 wt %.

The binder phase can comprise one or more of Co, Ni and Fe.

In one embodiment of the present invention, the binder phase mainly comprises Co. By that is herein meant that, as raw material for the binder phase, only Co is added. However, during manufacturing other elements might dissolve partly in the Co.

According to the present invention, the gradient surface zone is depleted of binder phase, i.e. the binder phase content in the gradient surface zone is lower than the binder phase content in the bulk of the cemented carbide. One way to measure the binder phase content is by Microprobe Jeol JXA8530 F with an EDS/WDS detector.

The thickness of the gradient surface zone is suitably between 50 to 400 µm, preferably between 120 to 250 µm. The surface gradient zone is defined as the area between the surface of the tool and the point where the binder phase content is no longer changing, i.e. where the bulk starts.

In one embodiment of the present invention, the binder phase content in the gradient surface zone is 0.2 to 0.9 of the binder phase content in the bulk. The increase of the binder phase content in the gradient surface zone starting from the surface towards the bulk is gradual until the end of the gradient surface zone.

The graphite content in the cutting tool comprising a substrate of cemented carbide is such that graphite precipitates can clearly be seen when using a Light Optic Microscope (LOM). The graphite can be seen in the gradient surface zone and in some cases also throughout the whole cemented carbide body, i.e. both the gradient surface zone and bulk.

One way to describe the amount of free graphite is by C-porosity measured according to DIN ISO 4505. By this is herein meant that, in an image of a magnification of 100 times (fach), where the image includes the nose, preferably the cutting edge, of the tool and an area of the tool of at least 600 times 600 µm, the C-porosity in the area with the largest amount of free graphite is suitably between C02 and C08, preferably between C04 to C08, more preferably between C06 and C08.

In one embodiment of the present invention, the graphite is present in the gradient surface zone.

In one embodiment of the present invention, the graphite is only present in the gradient surface zone.

In one embodiment of the present invention, the cemented carbide consists of WC and Co and unavoidable impurities. The total carbon content in the product will vary with the WC-content since contributes to the total carbon content.

For example, for a cemented carbide comprising 94 wt % WC and 6 wt % Co the total carbon content in the material is suitably between 5.80 to 5.95 wt %, preferably between 5.89 to 5.93 wt %. The carbon content can for example be measured by a LECO instrument as described in the examples.

In one embodiment of the present invention, the cemented carbide consists of WC and 5-7 wt % Co and unavoidable impurities.

It is common in the art to provide cemented carbide tools with a coating in order to increase the tool life. The cemented carbide according to the present invention can either be uncoated or be provided with a coating, suitably a CVD or PVD coating known in the art.

In one embodiment of the present invention, a cutting tool according to the present invention is suitably uncoated.

In one embodiment of the present invention, the cemented carbide body is provided with a coating useful for wear detection, e.g. TiN with a thickness of 0.2-3 µm.

In another embodiment of the present invention, the cemented carbide body is provided with a coating comprising carbon, e.g. a DLC coating with a thickness of 0.2-3 µm. deposited by e.g. CVD, in order to provide an extra carbon source.

In another embodiment of the present invention, the cemented carbide body is provided with a coating comprising a ZrC monolayer with a thickness of 0.2-3 µm by CVD deposition.

By cutting tool is herein meant an insert, drill or an end mill.

In one embodiment of the present invention, the cutting tool is a turning insert.

The cutting tool comprising a substrate of cemented carbide according to the present invention is suitable for machining non-ferrous alloys, most suitable for Ti or Ti-alloys and/or Ni-based alloys and most suitable for Ti or Ti-alloys. Examples of Ti and Ti alloys are suitably α, β and γ alloys, e.g. α-Ti and α-alloys such as $Ti_5Al_{2.5}Sn$, near α-alloys such as $Ti_6Al_2Sn_4Zr_2Mo$, α+β alloys such as $Ti_6Al_2Sn_4Zr_6Mo$ and $Ti_6Al_4V$. Examples of Ni-based alloys are Inconel 718, Waspaloy and Haynes 282 alloy.

The present invention also relates to the use of a cutting tool as described herein for machining in Ti or Ti-alloys.

The present invention also relates to a method of making a cutting tool comprising a substrate of cemented carbide according to the above.

The method of making a cutting tool comprising a substrate of cemented carbide according to the present invention where a first cemented carbide body having a certain carbon content and then subjecting said first cemented carbide body to a sintering step in a carburizing environment.

The first cemented carbide body can be any cemented carbide body with a carbon content within a range determined by the width of the two-phase region, i.e. in the zone for WC+solid binder phase at 1000° C. in the phase diagram for that particular cemented carbide composition.

Figure 2:
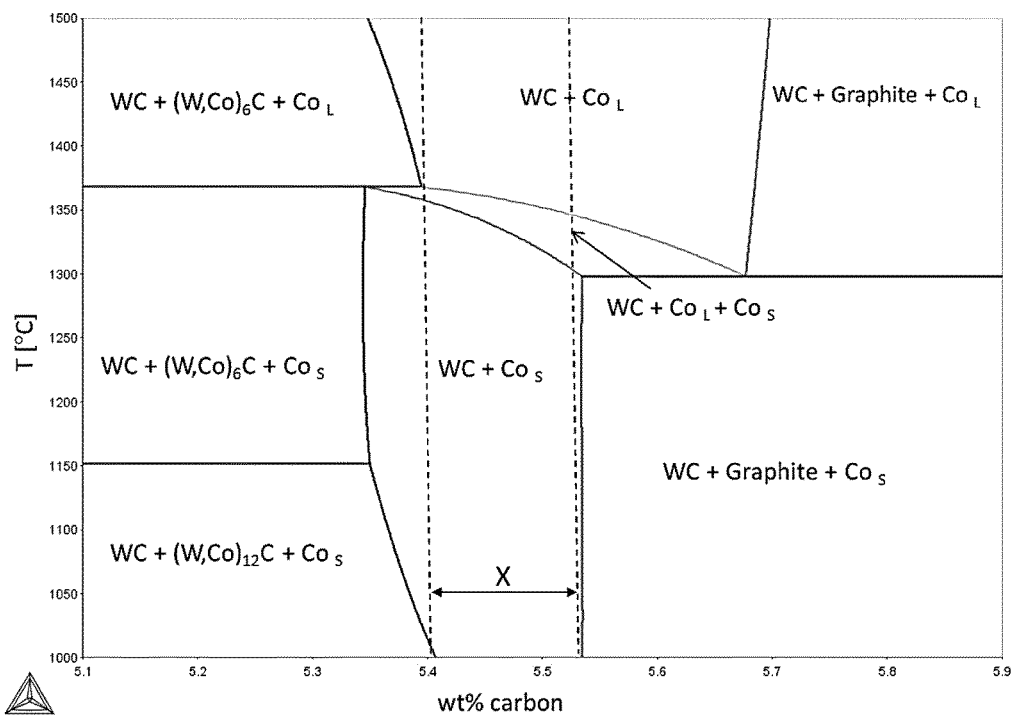
FIG. 2 shows a phase diagram for cemented carbide containing WC and 10 wt % Co.

It is well known in the art that, depending on the composition, e.g. presence of Cr or other binder phase metals such as Fe or Ni, the carbon limits for this region varies. The carbon limits for the two phase region also varies with the WC content. This is shown in FIG. 1 (for 94 wt % WC+6 wt % Co), and in FIG. 2 (for 90 wt % WC+10 wt % Co). As can be seen, the carbon content in the first cemented carbide body containing 94 wt % WC+6 wt % Co should be between the dotted lines, distance X, i.e. between 5.70 and 5.77 wt % C at a temperature of 1000° C. as defined in the phase diagram, whereas for 90 wt % WC+10 wt % Co, the corresponding range would be between 5.40 to 5.53 wt % C at a temperature of 1000° C. as defined in the phase diagram.

In one embodiment of the present invention, the carbon content in the first cemented carbide body is in the lower half of the range determined by the width of the two-phase region as has been described above.

In one embodiment of the present invention, for a WC—Co system comprising 6 wt % Co that would mean a carbon content in the first cemented carbide body is suitably between 5.70 to 5.77 wt %, preferably between 5.70 and 5.72 wt % C.

In one embodiment of the present invention, for a WC—Co system comprising 10 wt % Co that would mean a carbon content in the first cemented carbide body is suitably between 5.40 to 5.53 wt %, preferably between 5.40 and 5.46 wt % C.

In one embodiment of the present invention, the carbon content in the first cemented carbide body having a composition of WC+7 wt % Co, between 5.62 and 5.71 wt % C.

In one embodiment of the present invention, the carbon content in the first cemented carbide body having a composition of WC+8 wt % Co, between 5.55 and 5.65 wt % C.

In one embodiment of the present invention, the carbon content in the first cemented carbide body having a composition of WC+9 wt % Co, between 5.47 and 5.59 wt % C.

The first cemented body could also be manufactured according to conventional techniques from powders forming hard constituent and powders forming binder phase.

The powders forming hard constituents are selected from materials common in the art of making cemented carbides, like WC and carbides or carbonitrides of one or more of Ta, Ti, Nb, Cr, Hf, V, Mo and Zr.

The WC can be a high temperature carburized WC or a doped-WC with one or combinations of the following elements: Mo, Cr, Zr, Ta, Nb, Ti, Hf, V as described in WO2014/191505 or WO 2014/191511.

In one embodiment of the present invention, the first cemented carbide body is free from binder phase gradients. By that is herein meant that the cemented carbide body has an essentially evenly distribution of binder phase, i.e no gradient was aimed for when making the first sintering body.

At least a part of the hard constituents can also be added as recycled cemented carbide material. Such materials are usually recycled by metallurgical or chemical means, e.g. by the zinc recovery process (PRZ), electrolytic recovery, extraction or oxidation. Such a raw material can comprise many elements such as W, C, Co, and at least one or more of Ta, Ti, Nb, Cr, Zr, Hf, V and Mo.

The powders forming the binder phase can either be a powder of one single binder metal, or a powder blend of two or more metals, or a powder of an alloy of two or more metals. The binder metals are selected from Cr, Mo, Fe, Co or Ni, preferably from Co, Fe or Ni, most preferably Co.

The grain size of the added powders forming the binder phase is suitably between 0.5 to 3 µm, preferably between 0.5 to 1.5 µm. The amount of powders forming the binder phase is suitably between 2 to 25 wt %, preferably between 4 to 10 wt % and more preferably 5 to 7 wt %.

The method of making the first cemented carbide body is usually initiated by forming a slurry comprising the powders forming the hard constituents, i.e. WC and possibly any other additives according to the above, powders forming binder phase, an organic binder, e.g. PEG, or paraffin and a milling liquid, e.g. water/ethanol. The slurry is suitably milled in a ball mill or attritor mill.

Adjustment of the carbon content by addition of carbon black to the powder mixture prior to milling is done in order to achieve the desired carbon content in the first cemented carbide body as have been described above.

The slurry is then suitably dried into granules according to known techniques, in particular spray-drying.

Green bodies are subsequently formed from the dried granules by a pressing operation such as uniaxial pressing, multiaxial pressing etc. The green bodies is subsequently sintered according to any conventional sintering methods e.g. vacuum sintering, Sinter HIP, spark plasma sintering etc. in order to form the first cemented carbide body.

The first cemented carbide body is then sintered in a carburizing environment.

In one embodiment of the present invention, the sintering in a carburizing environment takes place in the same furnace as the sintering forming the first cemented body without moving the cemented carbide bodies in between.

In another embodiment of the present invention, the sintering in a carburizing environment takes place separately from the sintering forming the first cemented body, e.g. by using different furnaces.

The sintering temperature for the sintering in a carburizing environment will vary depending on the composition of the first cemented carbide body. The sintering in a carburizing environment takes place in a sintering furnace at a temperature being at least above the temperature for the formation of the first liquid, i.e. the lower limit of the $WC+Co_{liq}+Co_{sol}$ phase region. The $WC+Co_{liq}+Co_{sol}$ phase region can be seen in both FIG. 1 and FIG. 2.

The sintering temperature of the sintering in a carburizing environment is suitably below 1500° C.

For example, for a WC—Co with 6 wt % Co the temperature is suitably between 1300 to 1370° C., preferably between 1340 to 1350° C.

In one embodiment of the present invention, the carburizing environment is provided by one or more carbon containing gases, e.g. $CH_4$, CO. $H_2$ gas can also be present during sintering.

In one embodiment of the present invention, the carburizing environment can be provided by a carbon source such as a carbon coating or a carbon powder or a carbon solution.

The duration of the sintering in a carburizing environment is suitably between 15 minutes to 4 hours, preferably between 40 minutes and 2 hours. By duration is herein meant the time at the maximum temperature.

Example 1 (Invention)

A mixture made of WC, 6 wt % Co with additional carbon was mixed and blended for 18 h, pressed and sintered at 1410° C. for 1 h under vacuum conditions. After sintering the cemented carbide consists of WC embedded in Co metal binder phase. The total carbon after sintering was 5.70 wt % C. The carbon content is measured by combustion of the sample and then analyzing the products by solid state IR detection. The analysis takes place in a LECO WC-600 instrument. The accuracy of the values is ±0.01 wt %.

Figure 3:
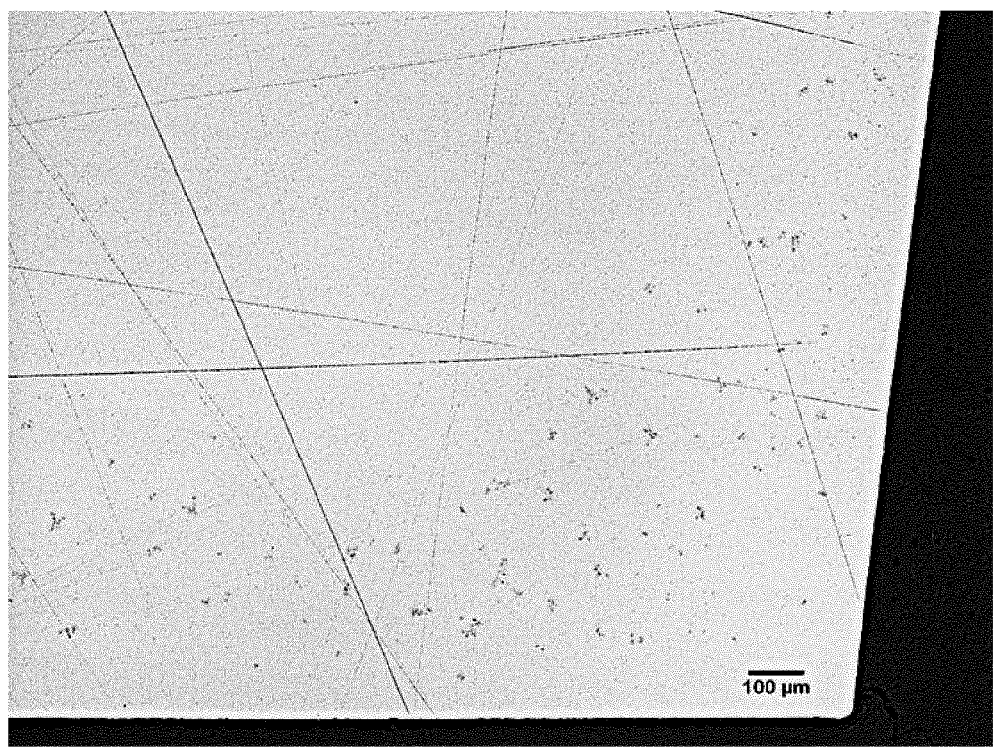
FIG. 3 shows a LOM image of cemented carbide according to the invention as described in Example 1.

After the first sintering step the cemented carbide body was subjected to a second sintering step by heat treating the cemented carbide body for 1 h at a temperature of 1350° C. in a sintering atmosphere containing a mixture of $CH_4/H_2$ to produce a Co-depleted gradient surface zone in the cemented carbide. After the heat treatment the cemented carbide comprised WC, Co and free graphite precipitates with a C-porosity of C06 according to ISO DIN 4505. Additionally due to the sintering treatment in an atmosphere with a carbon activity higher compared to the cemented carbide, a Co-depleted gradient surface zone of 130 µm forms in the cemented carbide. A LOM image of the cemented carbide body can be seen in FIG. 3.

The gradient is measured on a cross-section of the insert at three different positions, the nose, the rake and face side using a Microprobe Jeol JXA8530 F with an EDS/WDS detector with a beam energy of 15 kW 50 nA, a probe diameter of 1 µm and a dwelltime of 1000 ms.

The total carbon content measured by LECO after the heat treatment was 5.89 wt % C. This cemented carbide body is called Sample 1.

Example 2 (Invention)

A mixture made of WC, 6 wt % Co with additional carbon was mixed and blended for 18 h, pressed and sintered at 1410° C. for 1 h under vacuum conditions. After sintering the cemented carbide comprised WC embedded in Co metal binder phase. The total carbon content after sintering was 5.76 wt % C.

Figure 4:
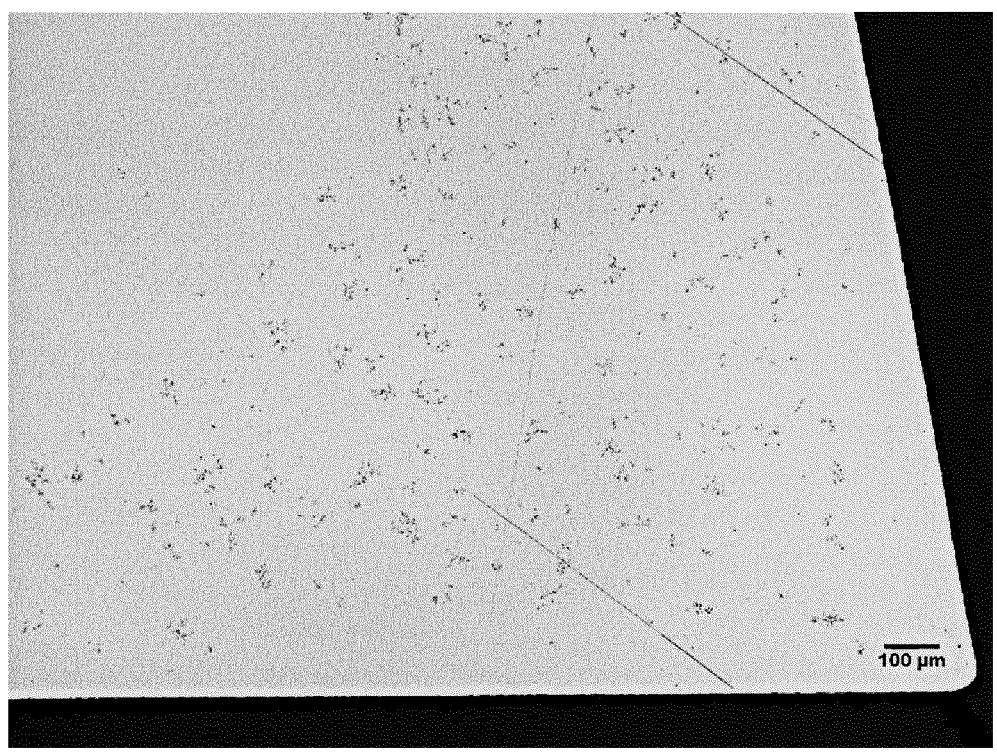
FIG. 4 shows a LOM image of cemented carbide according to the invention as described in Example 2.
Figure 5:
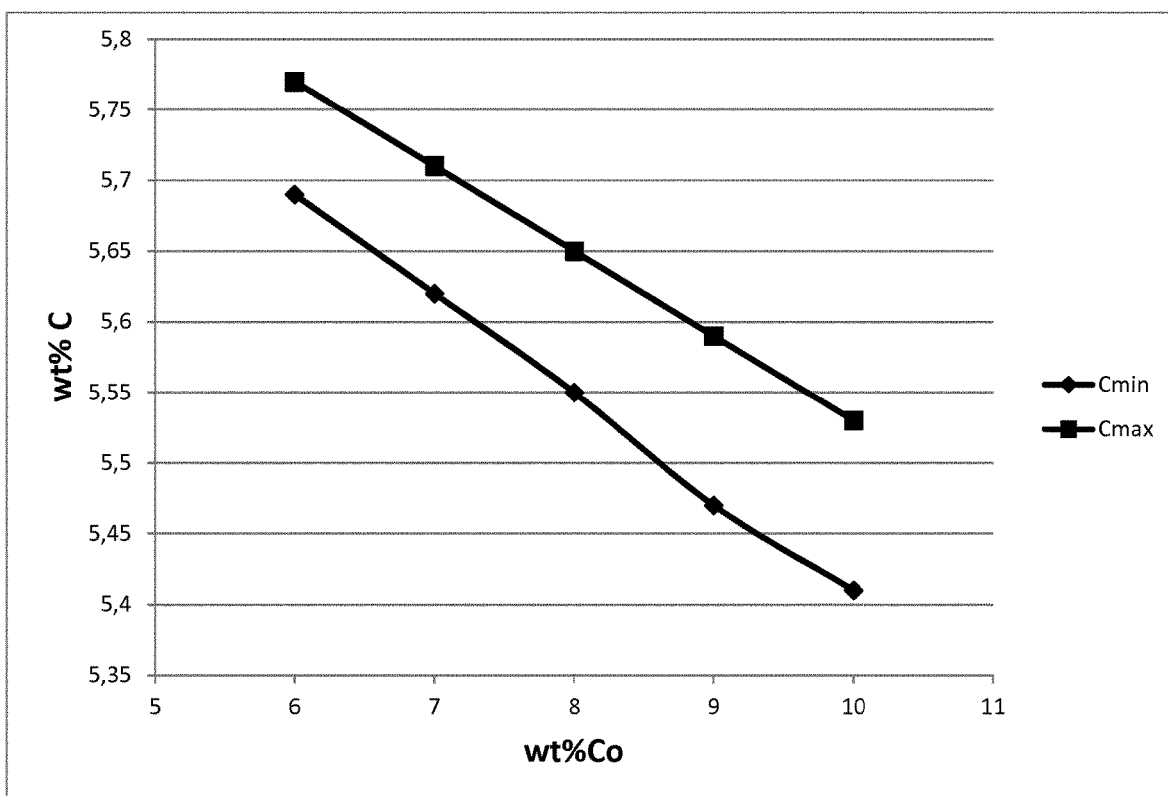
FIG. 5 shows a graph for the suitable carbon content for the first cemented carbide in wt % for different cobalt contents at 1000° C. as calculated by ThermoCalc.

After the first sintering step the cemented carbide body was subjected to a second sintering step by heat treating the cemented carbide body for 1 h at a temperature of 1350° C. in a sintering atmosphere containing a mixture of $CH_4/H_2$ to produce a Co-depleted gradient surface zone in the cemented carbide. After the heat treatment the cemented carbide comprised WC, Co and free graphite precipitates with a C-porosity of C06 according to ISO DIN 4505. Additionally due to the sintering treatment in an atmosphere with a carbon activity higher compared to the cemented carbide, a Co-depleted gradient surface zone of 100 µm forms in the cemented carbide. The total carbon content measured by LECO after the heat treatment was 5.91 wt % C. A LOM image of the cemented carbide body can be seen in FIG. 4. The C-porosity, gradient and carbon content have been measured as described in example 1. This cemented carbide body is called Sample 2.

Example 3 (Invention+ Coating)

A cemented carbide produced according to the invention (example 1) was coated with a multilayer consisting of a bonding layer of TiN of 0.3 μm and a ZrC layer of 1.6 μm produced by conventional chemical vapor deposition. This cemented carbide body is called Sample 3.

Example 4 (Comparative)

A mixture made of WC, 6 wt % Co with additional extra carbon was mixed and blended for 18 h, pressed and sintered at 1410° C. for 1 h under vacuum conditions. After sintering the cemented carbide comprised WC embedded in a Co metal binder phase. The total carbon measured by LECO after sintering was 5.76 wt % C. The carbon content has been measured as described in example 1. No gradient of free graphite were present. This cemented carbide body is called Sample 4.

Example 5 (Comparative)

A mixture made of WC, 6 wt % Co with added W metal was mixed and blended for 18 h, pressed and sintered at 1410° C. for 1 h under vacuum conditions. After sintering the cemented carbide comprised WC embedded in a Co metal binder phase and subcarbide $(W,Co)_xC$ $(M_6C, M_{12}C)$ precipitates, i.e. eta phase. The total carbon measured by LECO after sintering was 5.36 wt % C.

After the first sintering step the cemented carbide body was subjected to a second sintering step by heat treating the cemented carbide body for 1 h at a temperature of 1350° C. in a sintering atmosphere containing a mixture of $CH_4/H_2$. After the heat treatment the cemented carbide comprised WC, Co and subcarbide $(W,Co)xC$ $(M_6C, M_{12}C)$ precipitates, i.e. eta phase. Additionally a Co-depleted gradient surface zone free of subcarbide $(W,Co)xC$ $(M_6C, M_{12}C)$ precipitates with a thickness of 300 μm was formed in the cemented carbide. The total carbon content measured by LECO was 5.55 wt % C. No free graphite was observed. The gradient and carbon content have been measured as described in example 1. This cemented carbide body is called Sample 5.

Example 6 (Comparative)

A mixture made of WC, 6 wt % Co with additional extra carbon was mixed and blended for 18 h, pressed and sintered at 1410° C. for 1 h under vacuum conditions. After sintering the cemented carbide comprised WC embedded in a Co metal binder phase and free graphite precipitates with a C-porosity of C06 according to ISO DIN 4505. The total carbon measured by LECO after sintering was 5.80 wt % C. No gradient was present. The C-porosity and carbon content have been measured as described in example 1. This cemented carbide body is called Sample 6.

Example 7 (Comparative)

A mixture made of WC, 6 wt % Co with additional carbon was mixed and blended for 18 h, pressed and sintered at 1410° C. for 1 h under vacuum conditions. After sintering the cemented carbide comprised WC embedded in a Co metal binder phase and free graphite precipitates. The total carbon measured by LECO after sintering was 5.80 wt % C.

After the first sintering step the cemented carbide body was subjected to a second sintering step by heat treating the cemented carbide body for 1 h at a temperature of 1350° C. in a sintering atmosphere containing a mixture of $CH_4/H_2$ to produce a Co-depleted gradient surface zone on the surface of the cemented carbide. After the heat treatment the cemented carbide consists of WC, Co and free graphite precipitates with a C-porosity of C06 according to ISO DIN 4505. Additionally due to the sintering treatment in an atmosphere with a carbon activity higher compared to the cemented carbide, a gradient surface zone with cobalt binder gradient of 30 μm is formed in the cemented carbide. The total carbon content measured by LECO after the heat treatment was 5.90 wt % C. The C-porosity, gradient and carbon content have been measured as described in example 1. This cemented carbide body is called Sample 7.

Example 8 (Working Example)

All inserts were tested in a turning operation in a $Ti_6Al_4V$ alloy using the following conditions:
ap=0.2
Fn=0.2
Vc=75 m/min.

The tool life criterion was extended flank wear above 0.4 mm.

The results can be seen in Table 1.

TABLE 1

| Sample | wt % C in the first cemented carbide body | Note | Tool life in minutes |
|---|---|---|---|
| Sample 1 | 5.70 | Invention | 17 |
| Sample 2 | 5.76 | Invention | 12.5 |
| Sample 3 | 5.70 | Invention incl. coating | 18 |
| Sample 4 | 5.76 | Comparative, No gradient, No free graphite | 6.5 |
| Sample 5 | 5.36 | Comparative, Gradient + eta phase | 9 |
| Sample 6 | 5.80 | Comparative, No gradient, free graphite | 6.5 |
| Sample 7 | 5.80 | Comparative, gradient outside scope, free graphite | 7 |

The results show that the cemented carbides produced according to the invention showed significantly improved lifetime compared to all other cemented carbides. The results also show, that the carbon content in the first cemented carbide body, prior to the sintering in a carburizing atmosphere, is of importance for the performance of the cemented carbide body.

The invention claimed is:
1. A cutting tool comprising a substrate of cemented carbide comprising WC and a binder phase with a gradient surface zone with a thickness of between 50-400 μm having a binder phase gradient with a lowest binder phase content being in an outermost part of the gradient surface zone, the binder phase content in the gradient surface zone being 0.2 to 0.9 of binder phase in a bulk of the tool so that the binder phase content in the gradient surface zone is lower than a binder phase content in the bulk of the tool, and wherein the cutting tool includes an amount of free graphite such that a C-porosity is C02-C08 and wherein the free graphite is present in the gradient surface zone.

2. The cutting tool according to claim 1, wherein the thickness of the gradient surface zone is between 120 to 250 µm.

3. The cutting tool according to claim 1, wherein the amount of free graphite is such that a C-porosity is C04-C08.

4. The cutting tool according to claim 1, wherein the binder phase is cobalt.

5. The cutting tool according to claim 4, wherein the cobalt is between 4 to 10 wt %.

6. The cutting tool according to claim 1, wherein the cutting tool is uncoated.

7. The cutting tool according to claim 1, wherein the cutting tool is provided with a coating.

8. A method of making a cutting tool of cemented carbide according to claim 1, the method comprising the steps of:
providing a first cemented carbide body having a cemented carbide composition with a carbon content within a range determined by a width of the two-phase region, such as in a zone for WC+ solid binder phase, at 1000° C. in a phase diagram for the cemented carbide composition; and
subjecting said first cemented carbide body to a sintering step in a carburizing environment such that a gradient surface zone with a thickness of between 50-400 µm is formed.

9. The method according to claim 8, wherein the carbon content in the first cemented carbide body is in a lower half of the range determined by the width of the two-phase region.

10. The method according to claim 8, wherein the first cemented carbide body is formed by providing powders forming hard constituents including WC and powders forming the binder phase, which is subsequently milled, dried, and pressed into a green body and sintering said green body into the first cemented carbide body.

11. The method according to claim 8, wherein the binder phase is cobalt.

12. The method according to claim 8, wherein the duration of the sintering step in a carburizing environment is between 15 minutes and 4 hours.

13. The method according to claim 8, wherein the sintering temperature in the sintering step in a carburizing environment is at least above the temperature for the formation of a first liquid at a lower limit of a WC+Coliq+Cosol phase region, and below 1500° C.

* * * * *